United States Patent [19]
Konishi et al.

[11] Patent Number: 5,416,047
[45] Date of Patent: May 16, 1995

[54] METHOD FOR APPLYING PROCESS SOLUTION TO SUBSTRATES

[75] Inventors: Nobuo Konishi, Kofu; Hideyuki Takamori, Kumamoto; Masami Akimoto, Kumamoto; Kiyohisa Tateyama, Kumamoto; Masaaki Murakami, Kumamoto; Norimitsu Morioka, Kumamoto; Takashi Takekuma, Yamaga, all of Japan

[73] Assignees: Tokyo Electron Limited, Tokyo; Tokyo Electron Kyushu Limited, Tosu, both of Japan

[21] Appl. No.: 93,699

[22] Filed: Jul. 20, 1993

Related U.S. Application Data

[63] Continuation-in-part of Ser. No. 755,781, Sep. 6, 1991, Pat. No. 5,250,114.

[30] Foreign Application Priority Data

Sep. 7, 1990 [JP] Japan ................................. 2-237664
Jul. 20, 1992 [JP] Japan ................................. 4-214579

[51] Int. Cl.⁶ ............................................. H01L 21/30
[52] U.S. Cl. .................................... 437/225; 437/229; 427/421
[58] Field of Search ................. 437/225, 229; 118/52, 118/321, 323, 326, 64, 500, 501; 427/422, 421

[56] References Cited

U.S. PATENT DOCUMENTS

| | | | |
|---|---|---|---|
| 3,904,339 | 9/1975 | Dunn | 118/321 |
| 4,158,343 | 6/1979 | Nord | 118/323 |
| 4,190,015 | 2/1980 | Hillman | 118/321 |
| 4,416,213 | 11/1983 | Sakiya | 118/321 |
| 4,889,069 | 12/1989 | Kawakami | 118/52 |
| 4,941,426 | 7/1990 | Sago et al. | 118/52 |
| 4,989,345 | 2/1991 | Gill, Jr. | 118/52 |
| 5,002,008 | 3/1991 | Ushijima et al. | 118/321 |
| 5,061,144 | 10/1991 | Akimoto et al. | 118/500 |
| 5,089,305 | 2/1992 | Ushijima et al. | 118/321 |
| 5,095,848 | 3/1992 | Ikeno | 118/52 |

FOREIGN PATENT DOCUMENTS

| | | | |
|---|---|---|---|
| 58-124241 | 7/1983 | Japan . | |
| 59-3549 | 1/1984 | Japan . | |
| 59-232417 | 12/1984 | Japan . | |
| 61-140355 | 8/1986 | Japan . | |
| 62-114225 | 5/1987 | Japan . | |
| 62-195118 | 8/1987 | Japan . | |
| 62-201930 | 12/1987 | Japan . | |
| 63-77569 | 4/1988 | Japan . | |
| 1-276722 | 11/1989 | Japan | 118/323 |

Primary Examiner—Mary Wilczewski
Attorney, Agent, or Firm—Oblon, Spivak, McClelland, Maier & Neustadt

[57] ABSTRACT

A substrate solution-processing method comprising the steps of preparing a pair of spin chucks by which semiconductor wafers are supported, a housing by which the wafers supported by the spin chucks are enclosed, motor for rotating the spin chucks, a nozzle through which developing or resist solution is applied to each wafer, means for moving the nozzle between the wafers, and a waiting trench at which the nozzle is kept waiting, setting substantially same the times needed to finish the cycles of processing the wafers supported on at least two spin chucks and delaying one process cycle from the other, and keeping the nozzle waiting at the waiting trench unless developing or resist solution is applied to each wafer through the nozzle.

10 Claims, 10 Drawing Sheets

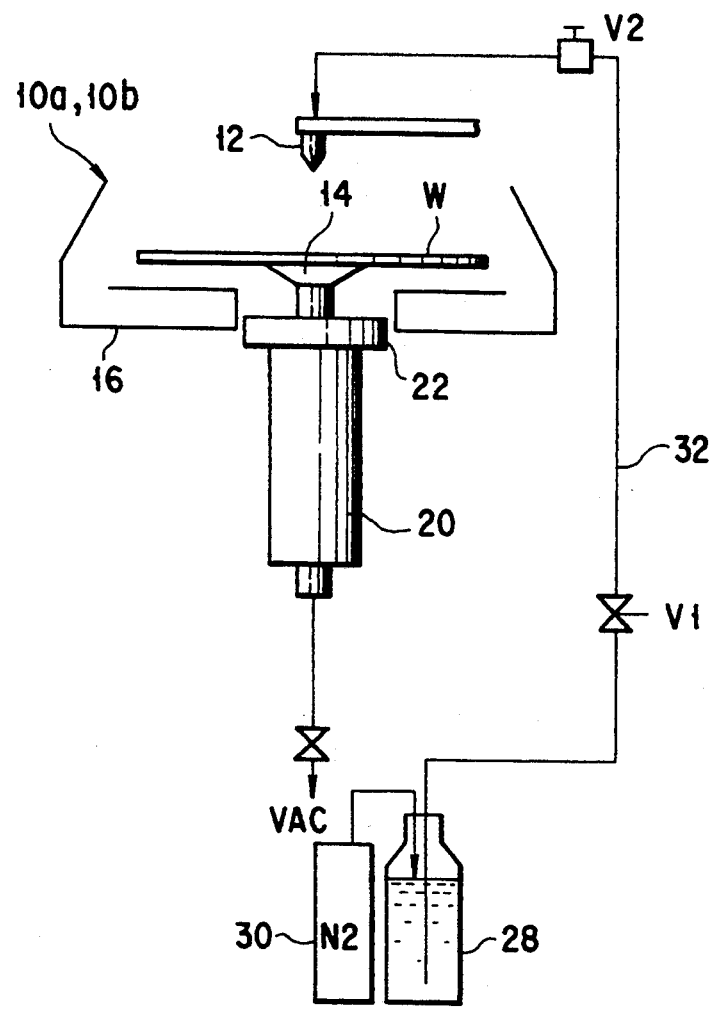
F I G. 4

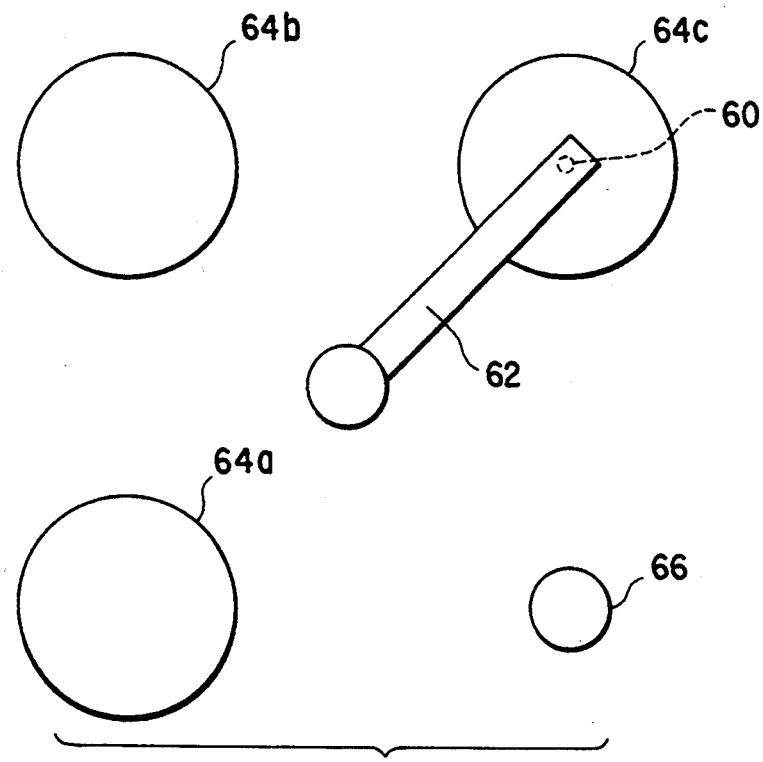
F I G. 6
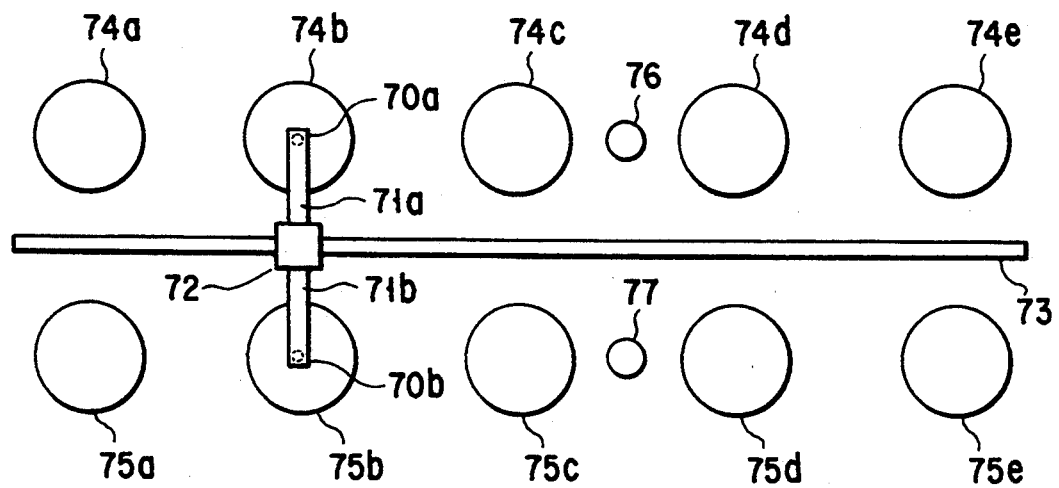
F I G. 7

METHOD FOR APPLYING PROCESS SOLUTION TO SUBSTRATES

CROSS-REFERENCE TO THE RELATED APPLICATION

This application is a continuation-in-part of U.S. patent application Ser. No. 07/755,781, filed on Sep. 6, 1991, now U.S. Pat. No. 5,250,114.

BACKGROUND OF THE INVENTION

1. Field of the Invention

The present invention relates to a method for applying liquid such as developing solution (developer) and resist solution to substrates, particularly semiconductor wafers.

2. Description of the Related Art

As the conventional liquid applying method, there can be mentioned the apparatus for use with the semiconductor device manufacturing system to coat resist solution to semiconductor wafers.

This liquid applying apparatus usually comprises a processing unit including a spin chuck for sucking, holding and rotating the semiconductor wafer and a cup for housing the semiconductor wafer on the spin chuck therein to conduct the process of developer or resist solution relative to the semiconductor wafer, and a nozzle for dispensing the developer or resist solution onto the semiconductor wafer in the cup.

The resist solution is dropped onto the semiconductor wafer through the nozzle and the semiconductor wafer is rotated at high speed by the spin chuck, so that resist film can be uniformly coated on the semiconductor wafer by centrifugal force thus created.

In the case of this apparatus, one nozzle is used for one processing unit and after the developer or the resist solution is sprayed or dispensed onto the semiconductor wafer through the nozzle, the nozzle is held ready for a next process until a series of coating steps relative to the semiconductor wafer are finished. After these liquid applying steps relative to the semiconductor wafer are finished, a next semiconductor wafer is carried into the processing unit and the nozzle dispenses the developer or the resist solution onto this semiconductor wafer. Therefore, the interval at which the resist solution is dispensed onto the semiconductor wafers through the nozzle becomes long and that part of the developer or the resist solution which is at the tip of the nozzle is likely to become hard while the nozzle is waiting for a next dispensation of the resist solution. This hardening of the resist solution causes the semiconductor wafers not to be uniformly coated with the resist solution and the quality of products not to be kept certain. The yield of products is thus made low.

As disclosed in Published Unexamined Japanese Patent Applications No. 58-124241 and No. 62-195118, there is conventionally well-known another coating apparatus intended to make its processing efficiency two times by using two processing units. Even in the case of this apparatus, however, one resist nozzle is also used only for one processing unit. As already mentioned above, therefore, the interval of dispensing the developer or the resist solution onto the semiconductor wafers is also long and the yield of products is thus made low by the hardening of the resist solution at the tip of the nozzle.

Further, the whole of the apparatus becomes complicated in structure. In addition, the resist liquid coating process cannot be uniformly applied to the semiconductor wafers because the two resist nozzles are independently used for their corresponding processing units.

Still further, solution drops separated from the wafer by centrifugal force are splashed back by inner walls of the cup to again adhere to the wafer. This causes the wafer to be irregularly developed. In addition, solution drops are likely to come outside the cup and the surroundings of the cup are thus contaminated in the conventional cases.

SUMMARY OF THE INVENTION

The object of the present invention is to provide a method of processing substrates with solution whereby developing or resist solution can be more uniformly applied to the substrates, the whole of the system used can be made simpler in structure, and the solution process applied to the substrate in each process unit can be made more uniform.

According to an aspect of the present invention, there can be provided a method of applying process solution substrate comprising the steps of preparing plural support members for supporting substrates respectively, a housing for enclosing the substrates supported by the support members, means for rotating each support member, nozzle means for applying the process solution to each substrate, means for moving the nozzle means from the substrate to the other substrate, and a waiting trench at which the nozzle means is kept waiting; setting substantially same the times needed to finish the cycles of processing the substrates supported on at least two support members and delaying one process cycle from the other process cycle; and keeping the nozzle means waiting at the waiting trench except unless said process solution is applied to the substrates supported on the support members respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 is a view intended to explain a line through which the resist liquid is supplied to the coating apparatus;

FIGS. 6 and 7 are sectional views showing variations of the coating apparatus according to the present invention;

DETAILED DESCRIPTION OF THE PREFERRED EMBODIMENTS

Figure 1:
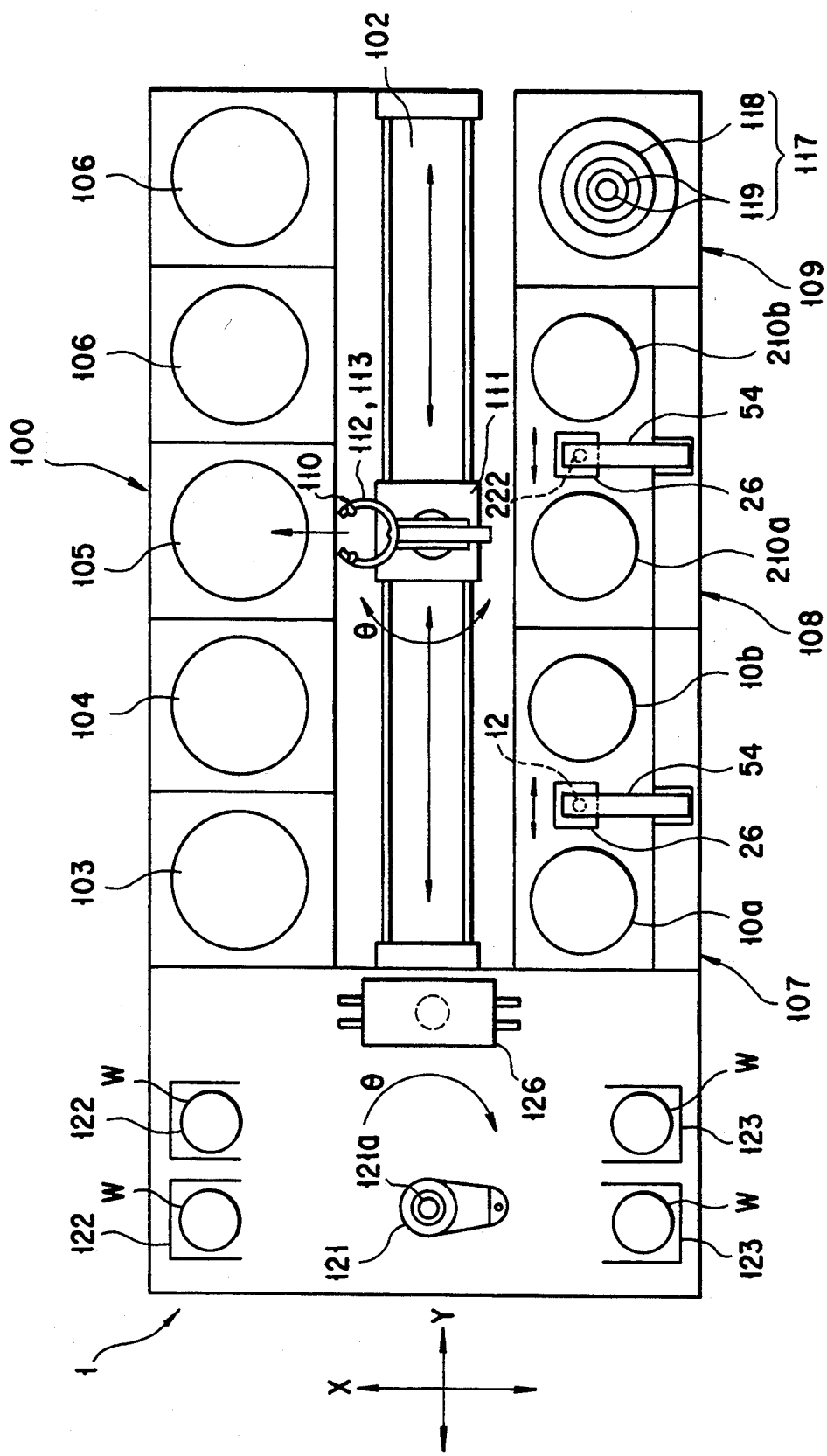
FIG. 1 schematically shows a system for coating resist liquid to semiconductor wafers in which a coating apparatus according to the present invention is incorporated.

A coating system 100 shown in FIG. 1 can carry out all of processes starting from carrying semiconductor wafers into the system and ending with coating them in the system. This coating system 100 comprises a housing 101, and pre-heating, cooling, first and second heating and coating mechanisms 103, 104, 105, 106, and 107 each being arranged in the housing 101. A passage is arranged at the center of the housing 101, extending in the horizontal direction of the housing 101. The pre-heating, cooling, first and second heating mechanisms 103, 104, 105 and 106 are located on one side of the passage 102 and the coating mechanism 107 on the other side of the passage. Although the pre-heating and cooling mechanisms 103 and 104 are arranged side by side in FIG. 1, the cooling mechanism 104 is located in fact under the pre-heating mechanism 103.

Developing and exposing mechanisms 108 and 109 are arranged on the same side of the passage 102 on which the coating mechanism 107 is located. The developing mechanism 108 has a spray nozzle 12 through which developer is sprayed to each wafer W to develop it. The exposing mechanism 109 has a stepper through which light is what to the resist film of each wafer W to expose it.

An interface mechanism 126 is located at one end of the robot running passage 102 and the wafer W is transferred between a carrier mechanism 121 and a robot 110 by the interface mechanism 126. The interface mechanism 126 also serves to center the wafer W.

The robot 110 is arranged in the passage to move through the passage. The robot 110 includes a body 111 and two wafer sucking and holding tweezers 112 and 113. The body 111 can move along the passage in a direction (or traverse direction) Y and up and down in a direction (or perpendicular direction) Z. The tweezers 112 and 113 can become operative together in a direction (or rotating direction) θ but in a direction (or lengthwise direction) X independently of the other. They can carry a wafer W into and out of an optional one of the abovementioned mechanisms 103–107 and also carry and receive it to and from a wafer loading-/unloading mechanism which will be described later.

The wafer loading/unloading mechanism 120 is located by the housing 101 and it is provided with wafer cassettes 122 in which wafers W which will be process are housed, and with wafer cassettes 123 in which wafers W which have been process are housed. It also includes a tweezer 121 movable in the directions X and Y while sucking and holding the wafer W, and the unprocessed wafer W is picked up from one of the cassettes 122 by the tweezer 121 and the processed wafer W is received from one of the tweezers of the carrying means 120 by the tweezer 121. The wafer W can be transferred and received between the tweezers 112, 113 of the carrying means and the one 121 of the wafer loading/unloading mechanism 120 at the interface of the passage relative to the wafer loading/unloading mechanism 120.

Figure 2:
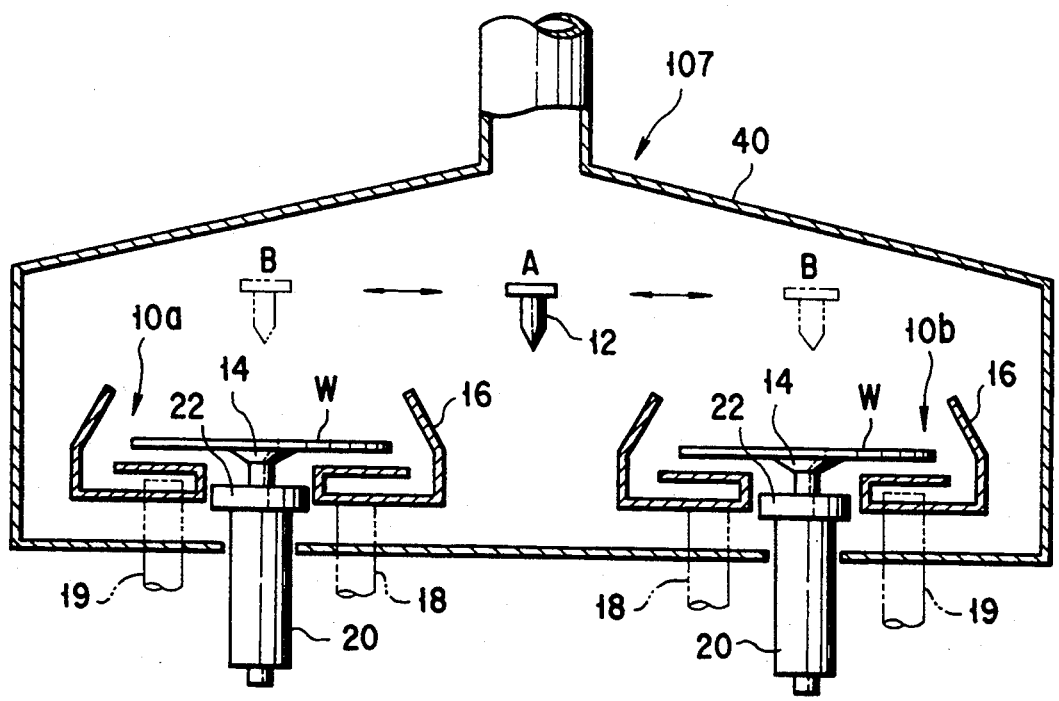
FIG. 2 is a sectional view showing the coating apparatus enlarged.
Figure 3:
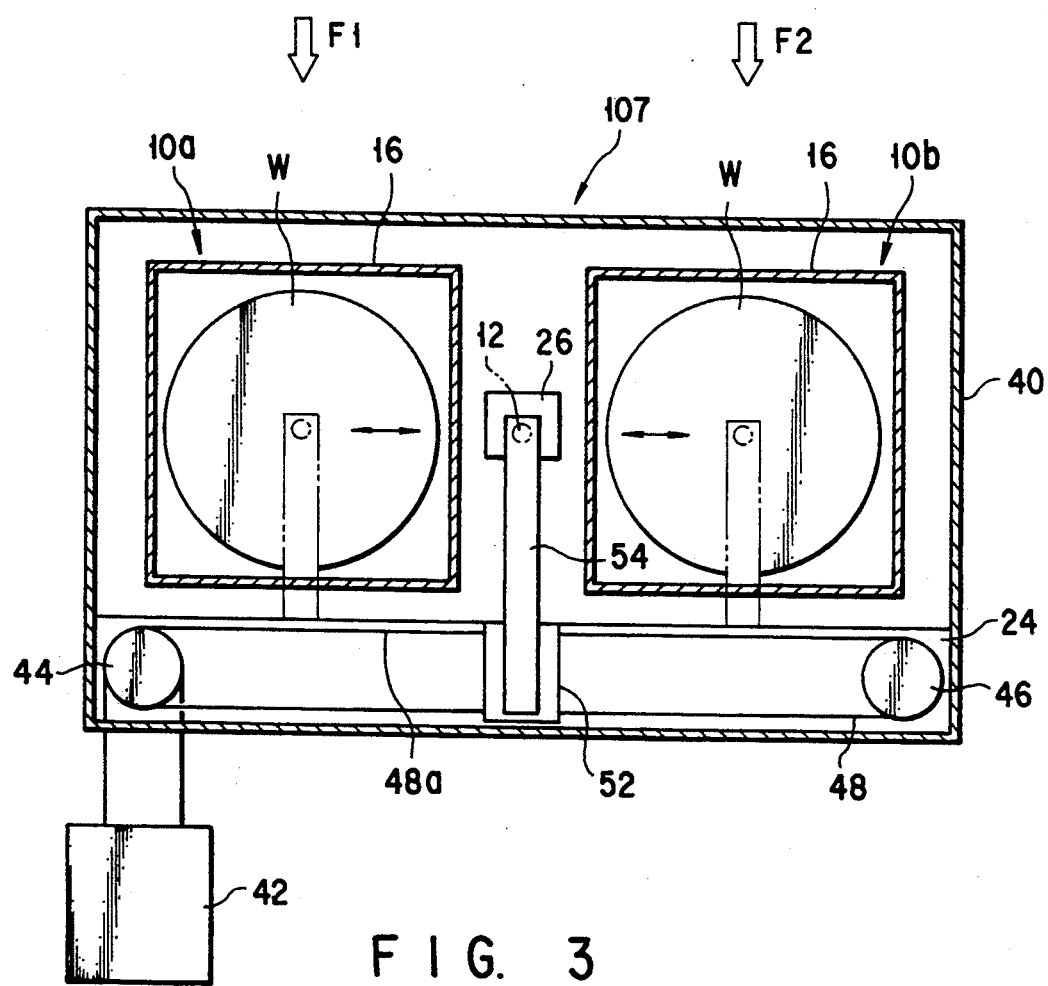
FIG. 3 is a sectional view showing the coating apparatus enlarged.

FIGS. 2 and 3 show the coating mechanism 107 in detail. The coating mechanism 107 has fundamentally the same layout as that of the developing mechanism 108. Two process units 210a, 210b and a spray nozzle 26 are arranged in the developing mechanism 108 and the spray nozzle 26 is reciprocated between these two process units 210a and 210b. Two processing units 10a and 10b are arranged in a common casing 40 and a resist nozzle 12 locates to be used commonly by the two processing units 10a and 10b. Both of the processing units 10a and 10b are arranged in a same atmosphere in the casing 40, thereby enabling the wafers W to be uniformly processed in the both processing units 10a and 10b.

Each of the processing units 10a and 10b is provided with a support 14 such as the spin chuck, which is fixed to the output shaft of a motor 20 so as to rotate that semiconductor wafer W at high speed which has been mounted and temporarily fixed on the spin chuck 14 by vacuum suction.

The motor 20 is a high performance one, excellent in acceleration, and it has a flange 22 at its top, by which it is fixed at an an appropriate position in the coating mechanism or apparatus. The temperature of the flange 22 can be adjusted by a temperature adjuster not to transmit the heat of the motor 20 to the above of the flange 22.

The semiconductor wafer W on the spin chuck 14 is enclosed by a cup 16 to prevent the coating or resist solution from being scattered outside the coating apparatus and onto the another adjacent semiconductor wafer W at the time when it is being coated with the resist solution. The cup 16 can move up and down and it is lifted to such a position as shown in FIG. 2 and stopped there at the time when the semiconductor wafer W is to be coated with the resist solution, while it is lowered downward from the position at the time when the wafer W is to be carried into and out of the processing unit. Drain and exhaust pipes 18 and 19 are connected to the underside of each of the cups 16.

The resist nozzle 12 is intended to supply or drop the resist liquid onto the semiconductor wafer W at such a position that is above and substantially in the center of the semiconductor wafer W supported by the spin chuck 14 in each of the processing units 10a and 10b. The resist nozzle 12 is freely moved or reciprocated between a waiting position A and the resist solution dropping position B in each of the processing units 10a and 10b, while being supported by the tip of an arm 54 of a nozzle moving means 24.

The cycle of coating the resist solution onto the wafer W in one of the processing units 10a and 10b is shifted from that in the other processing unit by a half cycle. In short, after the resist nozzle 12 is moved from its waiting position A to one of the positions B above the one processing unit 10a (or 10b) and caused to dispense the resist solution onto the wafer W in this processing unit 10a (or 10b), it is once returned to its waiting position A and then moved to the other of the positions B above the other processing unit 10b (or 10a) to dispense the resist solution onto the other wafer W in the other processing unit 10b (or 10a). In a case where no dispensation of the resist solution is carried out through the resist nozzle 12 every certain time period at the time when the process is shifted from one lot to the other, for example, dummy dispensations of the resist solution are carried out through the resist nozzle 12 at the waiting position A in order that the resist solution is prevented from hardening after contacting air for a long time. A waiting trench 26 which enables dummy dispensations of the resist solution to be conducted through the resist nozzle 12 is arranged for this purpose at the waiting position A. The resist nozzle 12 may be held in the atmosphere of the resist solution for a case where a little long waiting time is supposed during the exchange of wafers.

In order to prevent the resist solution from dropping during transfer of the nozzle, the resist solution is sucked back after the dispensation.

The nozzle moving means 24 is located between right and left rollers 44 and 46 and it includes an endless belt 48 which is driven right and left by a motor. A block 52 movable right and left together with a part 48a of the belt 48 is attached to the belt 48. The arm 54 is supported movable up and down by the moving block 52 and the resist nozzle 12 is supported at the tip of the arm 54.

Figure 8:
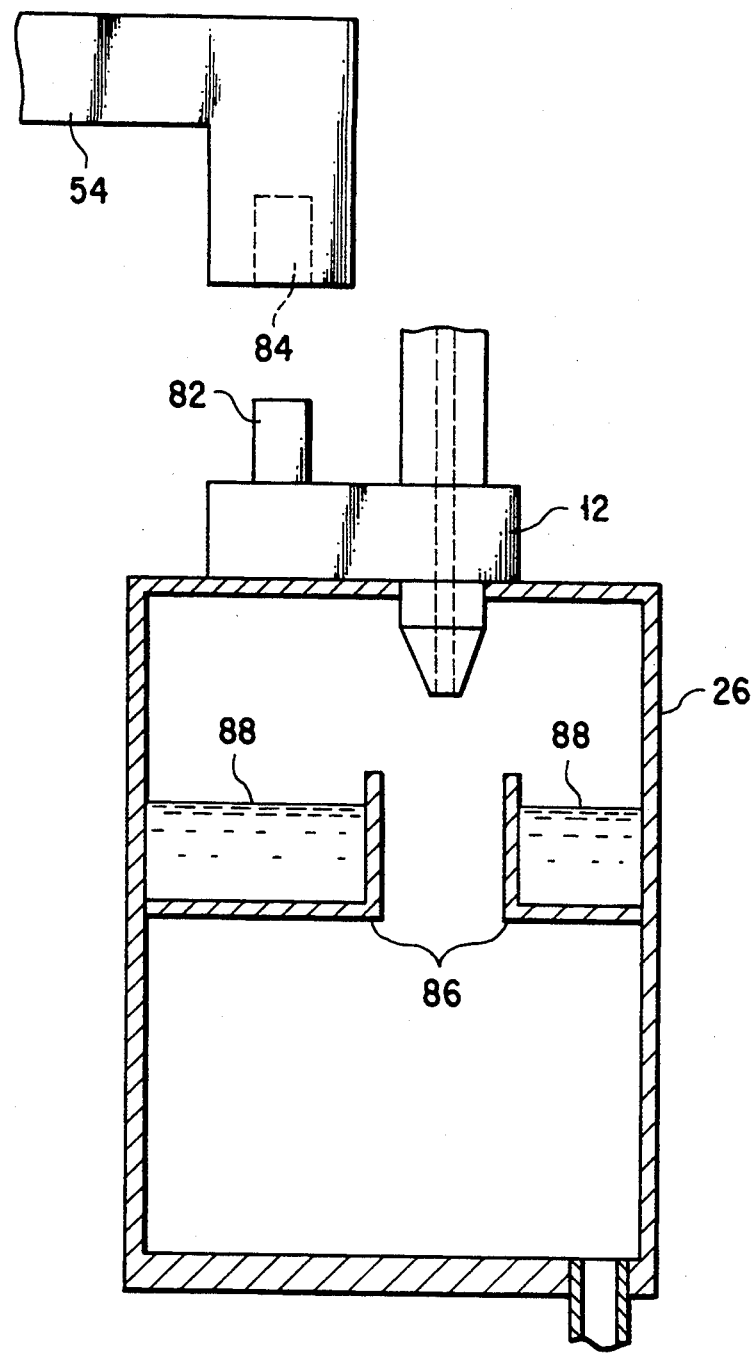
FIG. 8 is a view showing an example of coupling a nozzle with an arm for moving it, and an example of a waiting trench.
Figure 9:
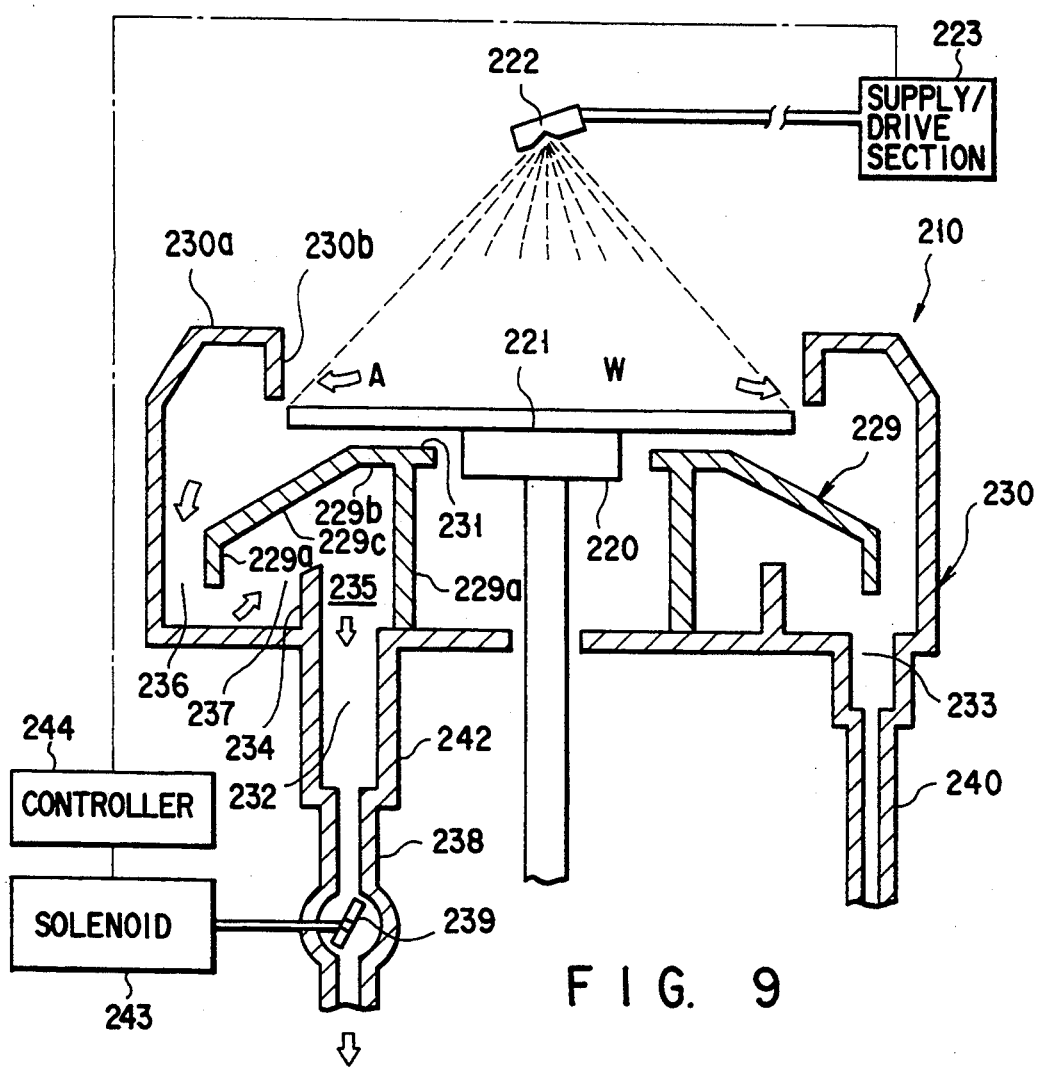
FIG. 9 is a partly-sectioned view showing a developer unit in the developing section.

FIG. 8 shows an example of detachably coupling the nozzle 24 with the arm 54. A projecting portion 82 is integrally formed on the body of the nozzle 24 and a cramping hole 84 having a size corresponding to the portion 82 is formed on the tip of the arm 54. The portion 82 is detachably held by a cramp member, which is controlled electrically, provided in the hole 84. The nozzle 12 sits on the waiting trench 26 when freed by the arm 54. A volatile organic solvent 88 is reserved in a pool 86 so as to decrease the hardening of the resist solution.

FIG. 4 shows a line through which the resist solution is supplied to the resist nozzle 12. This line is a pipe 32 extending from a resist solution vessel 28 and an $N_2$ pressurizing section 30 to the resist nozzle 12. The pipe 32 includes a valve V1 and a suck-back valve V2 on the way thereof. The suck-back valve V2 is intended to pull into the resist nozzle 12 that part of the resist solution which is exposed from the tip of the resist nozzle 12 because of surface tension after the resist solution is dispensed through the resist nozzle 12. The resist solution at the tip of the resist nozzle 12 can be thus prevented from becoming hard.

Figure 5:
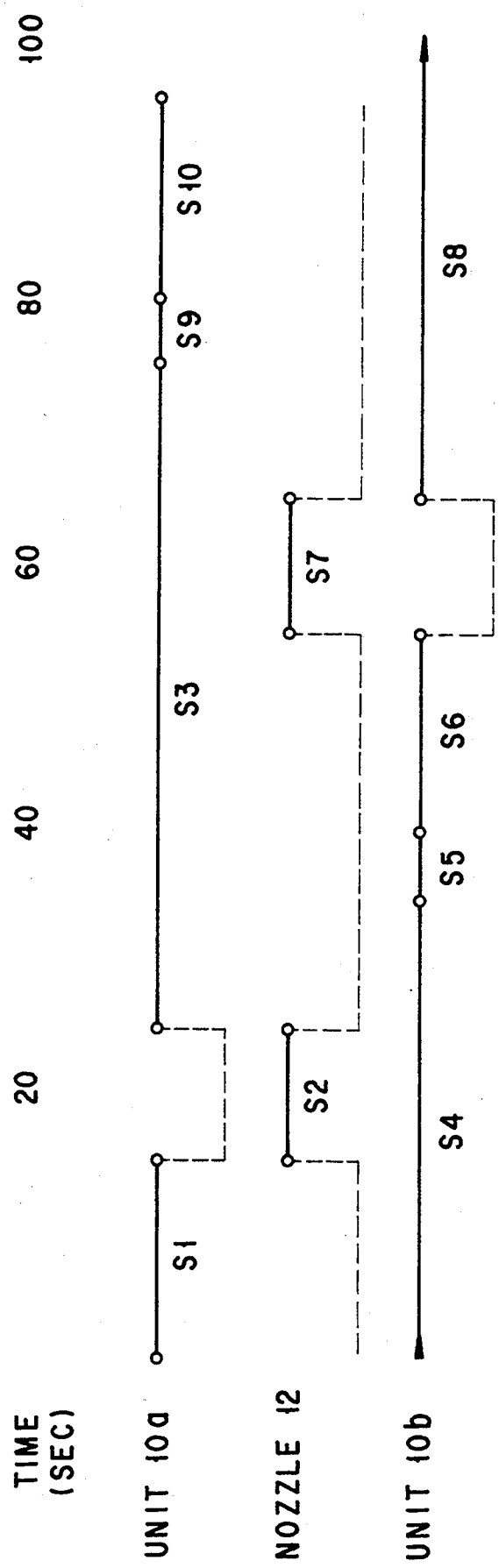
FIG. 5 is a time chart intended for a coating method according to the present invention.

A coating method according to the present invention will be described referring to a time chart shown in FIG. 5. The process described below is automatically carried out by using a program stored in a computer.

When the resist nozzle 12 is at its waiting position A, a wafer which is not processed yet is carried onto the spin chuck 14 in the one processing unit 10a. The wafer is carried into the processing unit 10a in a direction F1 an FIG. 3 by the carrying means 110 (see FIG. 1). If the previous wafer which has been processed is still on the spin chuck 14 in the processing unit 10a, it is removed from the spin chuck 14 by one of the tweezers 112 and 113 of the carrying means 110 and the next wafer carried is mounted on the chuck 14 by the other tweezer (Step S1 in FIG. 5). The center of the wafer is automatically aligned with the center of rotation of the chuck 14 at this time.

The arm 54 is then moved to grip and pull the resist nozzle 12 out of the waiting trench 26 at the waiting position A and further moved above the wafer on the spin chuck 14 in the unit 10a while holding the resist nozzle 12. The resist solution is dispensed or dropped onto the wafer through the resist nozzle 12 at this position, such as the center of the wafer. The resist nozzle 12 is then moved to the waiting position A by the arm 54 and supported by the waiting trench 26 (Step S2).

The chuck 14 in the unit 10a is rotated to uniformly scatter and coat the resist solution on the wafer due to centrifugal force thus created (Step S3).

The coating step caused by the rotation of the chuck 14 is already advancing in the other unit 10b prior to the step S1 in such a manner that the processing cycle in the other unit 10b is half shifted from that in the one unit 10a (Step S4).

After the coating is finished by the rotation of the spin chuck 14 in the other processing unit 10b, the cup 16 is lowered while the chuck 14 is lifted in this unit 10b (Step S5).

A wafer which is not processed yet is carried onto the chuck 14 in the other unit 10b in a direction F2 in FIG. 3 by the robot 110. The wafer which has been processed is removed this time from the chuck 14 by the one 112 (or 113) of the tweezers 112 and 113 of the robot 110 and the next wafer which has been carried is mounted on the chuck 14 by the other 113 (or 112) (Step S6).

The arm 54 is then moved to grip and pick up the resist nozzle 12 out of the waiting trench 26 at the waiting position A and further moved above the wafer mounted on the chuck 14 in the unit 10b while holding the resist nozzle 12. The resist solution is dropped onto the wafer through the resist nozzle 12 at this position. The resist nozzle 12 is then again moved to the waiting position A by the arm 54 and supported by the waiting trench 26 (Step S7).

The chuck 14 in the unit 10b is rotated to create centrifugal force, by which the resist solution is uniformly scattered and coated on the wafer (Step S8).

The coating caused by the rotation of the chuck 14 is finished in the unit 10a after the coating caused by the rotation of the chuck 14 is started in the unit 10b, and the cup 16 is lowered while the chuck 14 is lifted in the unit 10a (Step $9).

A wafer which is not processed yet is again carried onto the chuck 14 in the unit 10a by the robot 110 (Step S10).

When the one resist nozzle 12 is used commonly by the two processing units 10a and 10b in this manner, the interval at which the resist solution is dispensed onto the wafer through the resist nozzle 12 can be shortened and the hardening of the resist solution at the tip of the resist nozzle 12 which has often been seen in the case where the interval of resist solution dispensations is long can be thus reduced or prevented. When this interval is made shorter, as described above, there is created the possibility that the dummy dispensations at the waiting trench 26 become unnecessary.

Further, only one resist nozzle 12 is enough for the coating apparatus and this enables the whole of the apparatus to be made simpler in structure. In addition, the resist nozzle 12 is common to the two processing units and the resist solution is thus made common to them. The uniformity of processes conducted in the two processing units can be thus expected.

Although the mechanism for coating the resist solution to the semiconductor wafers has been mentioned as an example of the coating apparatus in the above-described embodiment, the present invention is not limited to this mechanism but it can be applied to various kinds of coating apparatus such as those intended to coat the resist solution, developer and magnetic matter to masks.

Although the arm 54 has been slid right and left in the above-described embodiment, it may be swung.

Although the two processing units have been used in the above-described embodiment, three or more processing units may be used. Further, it may be arranged that the number of the nozzles 12 is made plural and that the number of the processing units governed by each of the nozzles 12 is selected. The operation of these coating apparatuses can be controlled by computers.

FIGS. 6 and 7 schematically show variations of the coating apparatus according to the present invention wherein three or more processing units are arranged relative to one nozzle.

In FIG. 6, a resist nozzle 60 is carried by a moving means 62 of the swing type. Three processing units 64a–64c and a waiting trench 66 are arranged on that track on which the moving means 62 is swung.

In FIG. 7, two resist nozzles 70a and 70b are carried by a moving means 72 which is provided with a pair of moving arms 71a and 71b extending in reverse directions from it and with a linear rail 73. Five processing units 74a–74e and a waiting trench 76 are arranged on the side of the nozzle 70a and five processing units 75a–75e and a waiting trench 77 are arranged on the side of the nozzle 70b.

Some developing units 210 (210a or 210b) which will be used in the developing mechanism will be described with reference to FIGS. 9 through 13.

A spin chuck 220 is arranged at the center of a developing unit 210 and the wafer a is sucked and held on a top 221 of the spin chuck 220. A shaft of the spin chuck 220 is connected to a drive shaft of a motor (not shown). The drive motor is connected to a controller 243 by which the rotation number of the spin chuck 220 is controlled.

The spin chuck 220 is enclosed by inner and outer cups 229 and 230. A spray nozzle 222 is located above the spin chuck 220. It is communicated with a supply/drive section 223 and developer is sprayed to the wafer W on the top 221 of the spin chuck 220 through it. The supply/drive section 223 includes a developer tank, a pump and a nozzle-moving mechanism.

The inner cup 229 comprises an erected portion 229a, a horizontal portion 229b, a tilted portion 229c and an outer circumference 229d. The erected portion 229a is made cylindrical and erected from the bottom of the outer cup 230. The horizontal portion 229b is on the erected portion 229a to form a top 231 of the inner cup 229. The tilted portion 229c extends down-wards from the outer rim of the horizontal portion 229b, while making its diameter larger and larger as it comes nearer to the bottom of the outer cup 230. The outer circumference 229d ends near the bottom of the outer cup 230, extending vertically downwards from the peripheral portion of the tilted portion 229c. These portions 229a–229d, the side wall and bottom of the outer cup 230 and a partition member 234 form three ring-shaped flow paths 235, 236 and 237 which are concentric with one another. These three ring-shaped flow paths 235, 236 and 237 are communicated with one another to form a labyrinth.

The outer cup 230 has a open top, through which the wafer W is carried into and out of the outer cup 230. Air-exhausting and waste solution draining holes 232 and 233 are formed in the bottom of the outer cup 230. The air-exhausting hole 232 is communicated with the inner ring-shaped flow path 235. The waste solution draining hole 233 is communicated with the outer ring-shaped flow path 236.

A flow rate interference portion 242 is connected to the air-exhausting hole 232. Its inner diameter is same as that of the air-exhausting hole 232. It is intended to make the flow of air A smooth near the air-exhausting hole 232. A pipe 238 is connected to its front end. The inner diameter of this pipe 238 is smaller than that of the air-exhausting hole 232.

A damper 239 is arranged in the pipe 238. A damper drive section is connected to a solenoid 243, which is connected to a controller 244 by which the damper 239 is controlled. The controller 244 is electrically connected to the supply/drive section 223 of the nozzle 222.

The open top of the outer cup 230 has a horizontal protection wall 230a extending inwards in the radial direction of the outer cup 230, and a vertical protection wall 230b extending downwards from the front rim of the horizontal protection wall 230a. The front (or lower) end of the vertical protection wall 230b is located extremely near the outer rim of the wafer W in this case, forming an extremely small space between them.

Figure 10:
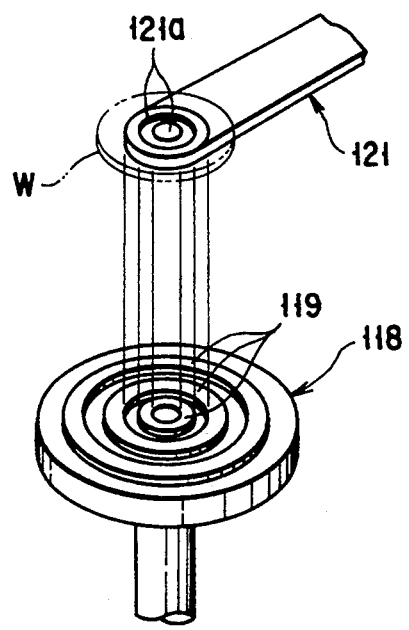
FIG. 10 is a perspective view showing a stepper chuck and a wafer carrying arm.

The exposing mechanism 109 will be described with reference to FIG. 10. Concentric projected rings 121a are formed on that face of an arm 121, on which the wafer a is held, not to overlap those 119 of a stepper chuck 118. Even if any particles adhere to the underside of the wafer W when the wafer a is to be held by the arm 121, therefore, they enter between tops of the projected rings 119 of the stepper chuck 118 and the underside of the wafer W so that the wafer a can be held correctly horizontal on the stepper chuck 118. This can prevent any focus error from being caused at the stepper chuck 118. Radial, lattice-shaped or any other optionally-shaped projections may be formed, instead of projected rings 119, on that face of the stepper chuck 118 on which the wafer a is held.

Figure 11:
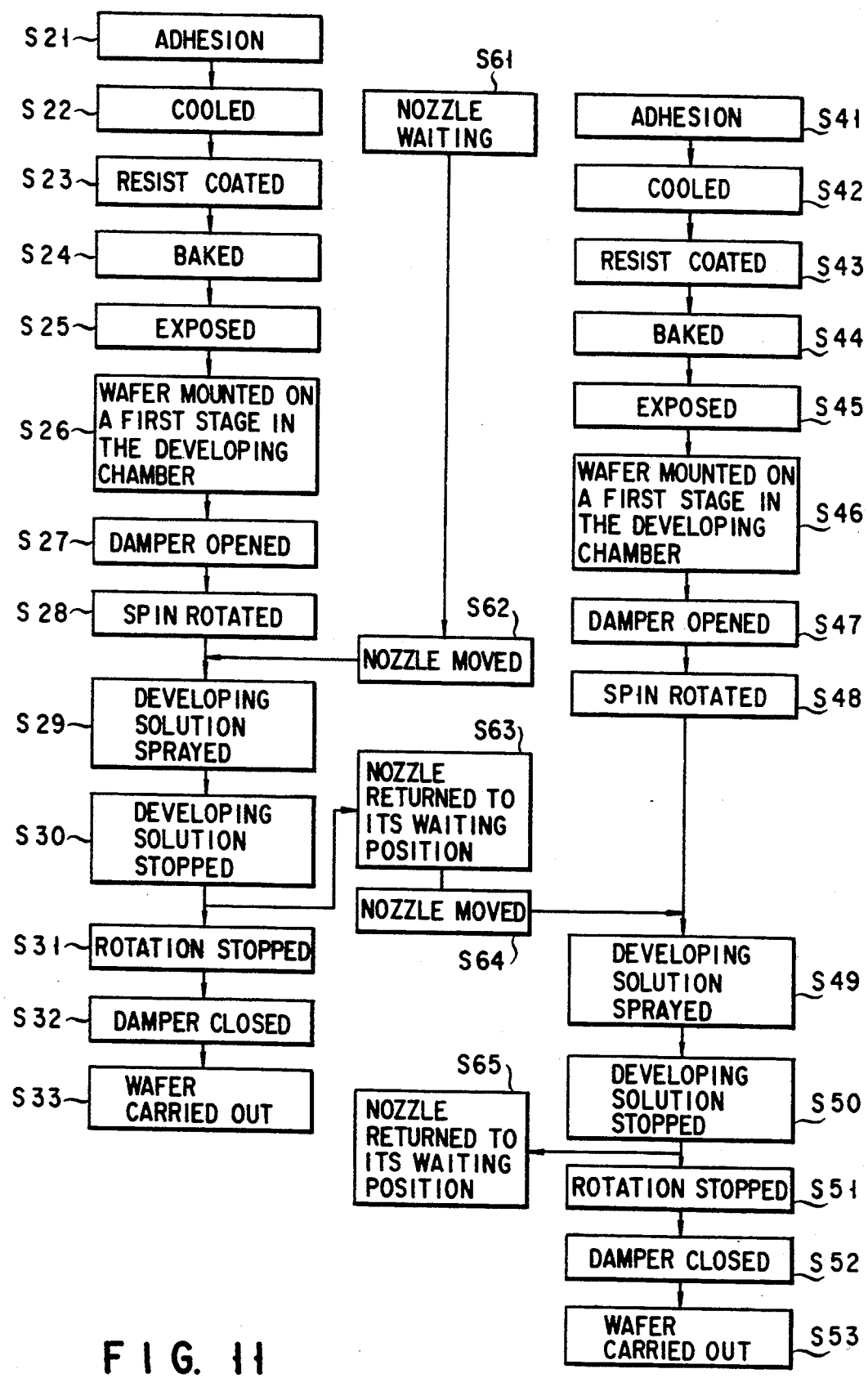
FIG. 11 is a flow chart showing how the substrate solution-processing method according to an embodiment of the present invention is carried out.

Referring to a flow chart in FIG. 11, it will be described how silicon wafers W are successively developed in the developing mechanism 108.

A silicon wafer W is picked up from one of the cassettes 122 and transferred to the interface mechanism 126 by which it is centered with its orientation flat aligned. It is carried into the chamber of the mechanism 103 by the robot 110 and adhesion-processed there (Step S21). The wafer W is then taken out of the adhesion mechanism 103 and cooled in the cooling mechanism 106. It is then carried into the coating mechanism 107. It is coated with photo-resist to form a resist layer, which has a predetermined thickness, on it (Step S23).

The wafer a is pre-baked in the heating mechanism 104 (Step S24). Light having a predetermined pattern is shot to it in the exposing mechanism 109 to expose its resist layer (Step S25). It is sequentially carried from the exposing mechanism 109 into the heating mechanism 104, the cooling mechanism 106 and the developing mechanism 108.

The wafer W is carried into the first unit 210a of the developing mechanism 108 and mounted on the first stage 220 (Step S26). It is sucked and fixed onto the top of the first stage 220. The damper 239 is then opened (Step S27) and that area which is enclosed by the inner and outer cups 230 and 231 is exhausted. The first stage 220 is spun (Step S28).

The nozzle 222 is kept waiting at the waiting trench 26 in this while (Step S61). When the spinning of the wafer W is started, the nozzle 222 is moved to the first unit 210a to spray developer to the wafer a (Step S29). It takes about three seconds to start the exhaust and then the spraying of developer. When developer is sprayed for a predetermined time period, the supply of developer is stopped (Step S30). The nozzle 222 is returned to the waiting trench 26 (Step S63).

The rotation of the first stage 220 is stopped (Step S31) and the damper 239 is closed (Step S32). The time needed to stop the supply of developer and close the damper 239 is about two seconds. This sequential control is achieved by a timer housed in the controller 244. The wafer W is carried out of the first unit 210a (Step S33).

Independently of the above-described one, another wafer a is adhesion-processed (Step S41), cooled (Step S42), resist-coated (Step S43), pre-baked (Step S44), and exposed (Step S45). The wafer W is then carried into the second unit 210b after heating and cooling the wafer W, and mounted on the second stage 220 in the developing mechanism 108 (Step S46). The damper 239 is opened (Step S47) and that area which is enclosed by the inner and outer cups 230 and 231 is exhausted. The second stage 220 is spun (Step S48).

When the spinning of the other wafer W is started, the nozzle 222 is moved to the second unit 210b (Step S64) to spray developer onto the other wafer W (Step S49). The time needed to start the exhaust and then the spraying of developer is about three seconds. When developer is sprayed for a certain time period, the supply of developer is stopped (Step S50). The nozzle 222 is returned to the waiting trench 26 (Step S65).

The spinning of the second stage 220 is stopped (Step S51) and the damper 239 is closed (Step S52). It takes about two seconds to stop the supply of developer and close the damper 239. The other wafer a as carried out of the second unit 210b (Step S53).

The operation of the above-mentioned steps S46–S53 is preferably delayed from that of the above-mentioned steps S26–S33 by a half cycle, but the former may be delayed from the latter by a quarter, a third, two third or three fourth cycle.

When the wafers W are processed as described above, the following merits can be obtained.

The operation rate of the nozzle can be increased to more stably and uniformly develop the wafers W. The throughput of the system and the productivity of wafers can be thus enhanced to a greater extent.

The volume of each unit chamber can be made smaller. The processing atmosphere in each chamber can be thus more easily controlled. In addition, the system can be made smaller in size.

The exhaust in that area enclosed by the inner and outer cups can be made smoother. Mist-like developer can be thus prevented from adhering to the wafers to irregularly develop them. In addition, it can be prevented from being spread outside the cups and this prevents the surroundings of the developing unit from being contaminated.

Other embodiments of the present invention will be described referring to FIGS. 12 and 13. Same components as those of the above-described first embodiment will be described only when needed.

Figure 12:
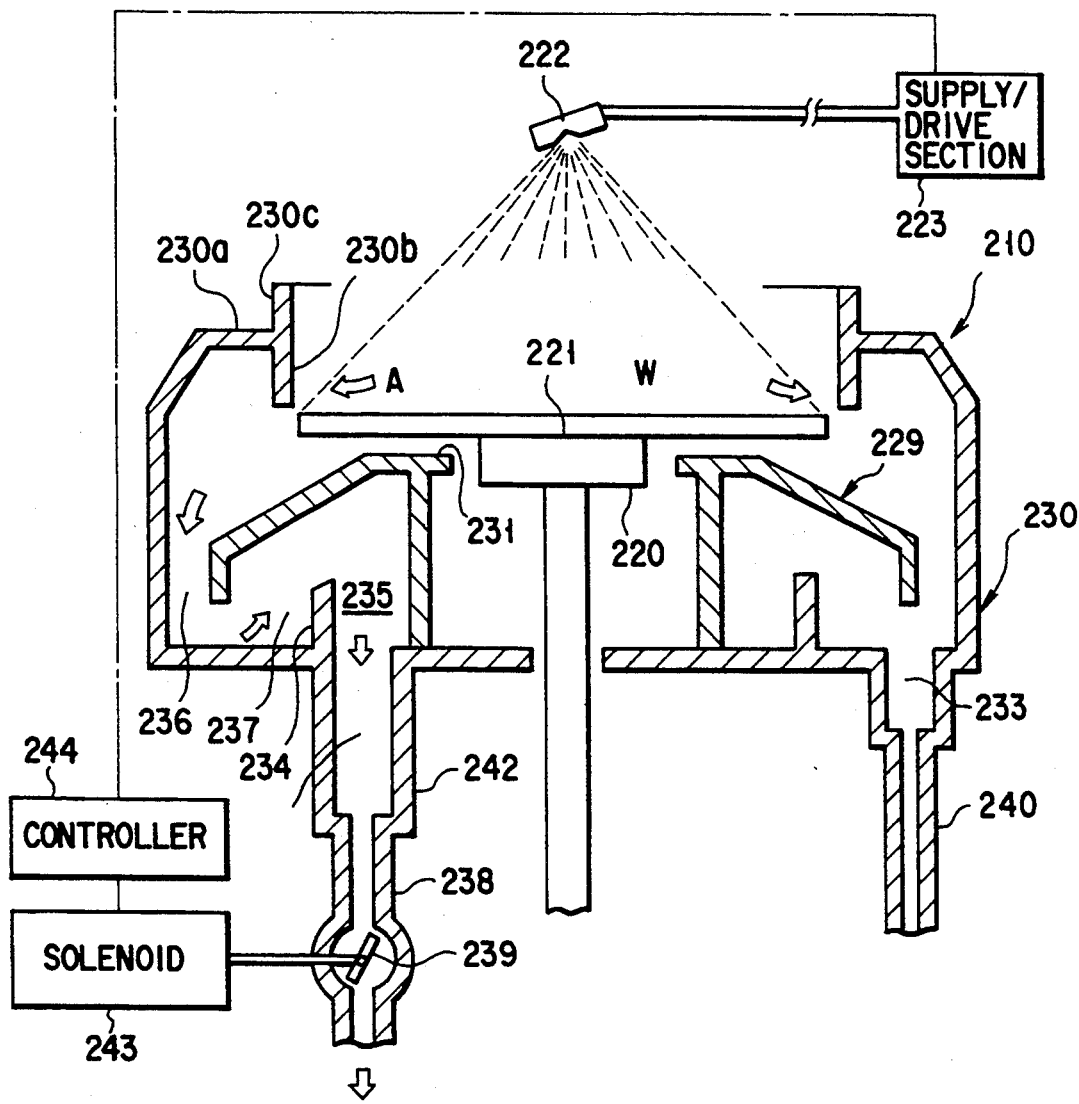
FIG. 12 is a partly-sectioned view showing another developer unit.

As shown in FIG. 12, the vertical protection wall 230b may be erected upwards from the horizontal protection wall 230a to form an erected portion 230c. When the open top of the outer cup 230 is enclosed by the erected portion 230c in this manner, the down flow of mist-like developer into the lower area 236 can be made smoother while developer is being sprayed to the wafer W. The amount of mist-like developer floated can be thus reduced to a greater extent.

Figure 13:
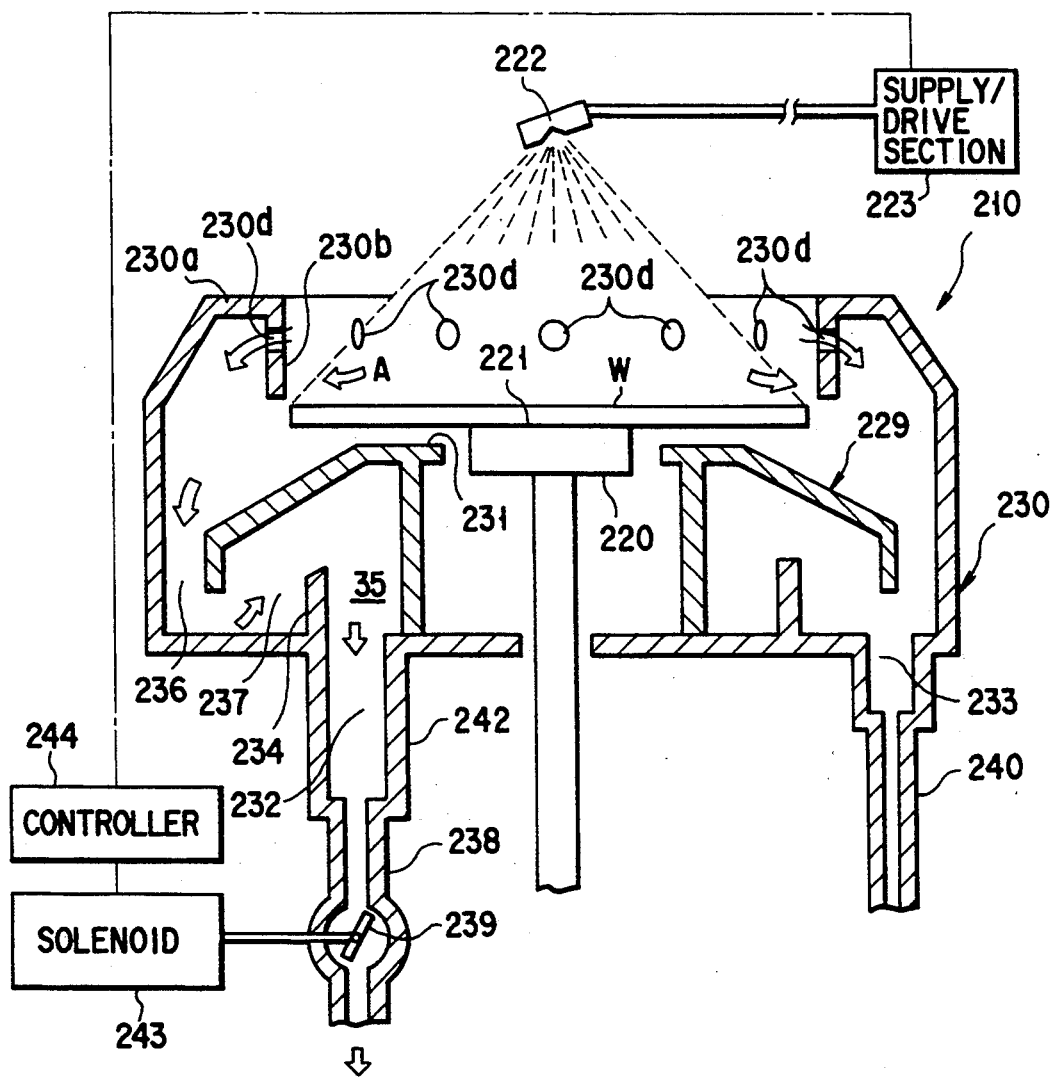
FIG. 13 is a partly-sectioned view showing a further developer unit.

As shown in FIG. 13, paths or holes 230d may be formed in the vertical protection wall 230b, communicating with the lower area 236. It is preferable that these paths 230d are separated from their adjacent ones by a certain interval. When the vertical protection wall 230b is provided with these paths 230d in this manner, the down flow of mist-like developer into the lower area 236 can be made smoother while developer is being sprayed to the wafer W. The amount of mist-like developer floated can be thus reduced to a greater extent.

The above-described embodiments of the present invention are used to process semiconductor wafers, but they can also be used to process glass substrate, LCD substrate, CD substrate and other substrates.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for applying process solution to substrates comprising the steps of:

providing support members for supporting substrates respectively, a housing for enclosing the substrates supported by the support members, means for rotating each support member, nozzle means for applying the process solution to each substrate, means for moving the substrates, and a waiting trench at which the nozzle means is kept waiting when said nozzle means is not applying said process solution;

setting a substantially same value for periods required to finish cycles of processing of at least two of the substrates supported on the support members and performing the process cycles at different times such that the nozzle means is used in both process cycles;

moving the nozzle means from the waiting trench to one of the support members, along a path located outside a region above other of the support members;

applying the process solution from the nozzle means to one of the substrates supported on one of the support members while the nozzle means is located above the substrate;

moving the nozzle means from the one of the support members to the waiting trench, along the path located outside a region above the other of the support members; and keeping the nozzle means waiting at the waiting trench unless said process solution is applied to the substrates supported on the support members respectively.

2. The method according to claim 1, wherein one process cycle is delayed from the other process cycle substantially by one-half of a process cycle period.

3. The method according to claim 1, wherein a resist solution is used as the process solution.

4. The method according to claim 1, wherein a developing solution is used as the process solution.

5. The method according to claim 1, wherein said support members used are two support members.

6. The method according to claim 1, further comprising the steps of:
preparing inner and outer cups by which the substrates supported on the support members are enclosed;
attracting drops of the process solution into a lower area in the outer cup through a clearance formed between a peripheral portion of substrate and the outer cup; and
forcedly discharging the process solution outside through flow paths formed between the inner and the outer cup.

7. The method according to claim 6, wherein the lower end of that portion of the outer cup which extends vertically downwards from an open top of the outer cup is located adjacent to the peripheral portion of substrate.

8. The method according to claim 6, wherein drops of the process solution are caused to flow into the lower area by that portion of the outer cup which extends vertically upwards from the open top of the outer cup.

9. The method according to claim 6, wherein paths or through-holes are formed in a vertical protection wall of the outer cup which extends downward from the open top of the outer cup, and drops of the process solution are caused to flow into the lower area in the outer cup through the paths.

10. The method according to claim 1, wherein the waiting trench and the support members are arranged in substantially the same plane and adjacent to one another, and the nozzle means is moved between the waiting trench and the support members.

* * * * *